(12) United States Patent
Chen et al.

(10) Patent No.: US 10,042,387 B2
(45) Date of Patent: Aug. 7, 2018

(54) WEARABLE TOUCH DEVICE AND WEARABLE TOUCH METHOD

(71) Applicant: BOE TECHNOLOGY GROUP CO., LTD., Beijing (CN)

(72) Inventors: Yanshun Chen, Beijing (CN); Tianyue Zhao, Beijing (CN); Yaohui Li, Beijing (CN); Qiushi Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 100 days.

(21) Appl. No.: 14/441,734

(22) PCT Filed: Aug. 29, 2014

(86) PCT No.: PCT/CN2014/085500
§ 371 (c)(1),
(2) Date: May 8, 2015

(87) PCT Pub. No.: WO2015/165187
PCT Pub. Date: Nov. 5, 2015

(65) Prior Publication Data
US 2016/0048158 A1    Feb. 18, 2016

(30) Foreign Application Priority Data

Apr. 28, 2014 (CN) .......................... 2014 1 0175457

(51) Int. Cl.
*G06F 1/16* (2006.01)
*G06F 3/041* (2006.01)
(Continued)

(52) U.S. Cl.
CPC .............. *G06F 1/163* (2013.01); *G06F 3/017* (2013.01); *G06F 3/041* (2013.01); *G06F 3/045* (2013.01);
(Continued)

(58) Field of Classification Search
None
See application file for complete search history.

(56) References Cited

U.S. PATENT DOCUMENTS 5,334,805 A * 8/1994 Knowles ............... G06F 3/0436
178/18.04
2010/0220054 A1    9/2010 Noda et al.
(Continued)

FOREIGN PATENT DOCUMENTS

CN 101819463 A 9/2010
CN 101819464 A 9/2010
(Continued)

OTHER PUBLICATIONS

Form PCT/ISA/210 issued in International application No. PCT/CN2014/085500 dated Aug. 29, 2014.
(Continued)

*Primary Examiner* — Nicholas J Lee
*Assistant Examiner* — Duane N Taylor, Jr.
(74) *Attorney, Agent, or Firm* — Nath, Goldberg & Meyer; Joshua B. Goldberg

(57) ABSTRACT

The present invention belongs to the field of control technology, particularly relates to a wearable touch device and a wearable touch method. A wearable touch device comprises a carrier, a projecting unit, a monitoring unit and a processing unit. The carrier is wearable, the projecting unit is used for projecting to a touch surface capable of being touched by a touch end, the monitoring unit is used for monitoring contact information between the touch end and the touch surface and sending the contact information to the processing unit, and the processing unit is used for processing the contact information to judge whether the touch end effec-
(Continued)

tively contacts the touch surface. The wearable touch device and the corresponding wearable touch method can ensure the touch effectiveness.

12 Claims, 3 Drawing Sheets

(51) Int. Cl.
*G06F 3/01* (2006.01)
*G06F 3/045* (2006.01)
*G09G 3/00* (2006.01)
*G01R 19/165* (2006.01)

(52) U.S. Cl.
CPC ........... *G09G 3/002* (2013.01); *G01R 19/165* (2013.01); *G09G 2354/00* (2013.01)

(56) References Cited

U.S. PATENT DOCUMENTS

| 2012/0218184 A1* | 8/2012 | Wissmar | G06F 3/0346 345/158 |
| 2012/0249409 A1* | 10/2012 | Toney | G06F 3/017 345/156 |
| 2012/0326833 A1 | 12/2012 | Aichi et al. | |
| 2013/0016070 A1 | 1/2013 | Starner et al. | |
| 2014/0055352 A1 | 2/2014 | Davis et al. | |

FOREIGN PATENT DOCUMENTS

| CN | 103605423 A | 2/2014 |
| CN | 103984437 A | 8/2014 |
| JP | 2003015810 A | 1/2003 |
| JP | 2007128304 A | 5/2007 |
| JP | 2010225131 A | 10/2010 |
| JP | 2010537302 A | 12/2010 |
| KR | 10-2006-0057518 A | 5/2006 |
| WO | 2012/156658 A1 | 11/2012 |

OTHER PUBLICATIONS

Form PCT/ISA/237 issued in International application No. PCT/CN2014/085500.
Office Action dated May 23, 2016 issued in corresponding Chinese Application No. 201410175457.6.
Office Action dated Apr. 12, 2016 issued in corresponding Korean Application No. 10-2015-7012701.
First Office Action dated Nov. 30, 2017 corresponding to Japanese application No. 2017-508723.
Extended European Search Report dated Dec. 1, 2017 corresponding to application No. 14859312.2-1972.

* cited by examiner

WEARABLE TOUCH DEVICE AND WEARABLE TOUCH METHOD

This is a National Phase Application filed under 35 U.S.C. 371 as a national stage of PCT/CN2014/085500, filed Aug. 29, 2014, an application claiming the benefit of Chinese Application No. 201410175457.6, filed Apr. 28, 2014, the content of each of which is hereby incorporated by reference in its entirety.

FIELD OF THE INVENTION

The present invention relates to the field of control technology, and particularly relates to a wearable touch device and a wearable touch method.

BACKGROUND OF THE INVENTION

With the development of science and technology, wearable technology appears currently. In short, the wearable technology refers to science and technology for exploring and creating equipment capable of being directly worn on body or integrated into clothes or accessories of users. Wearable intelligent equipment has become a new technological favorite and a development trend of future intelligent equipments.

The wearable intelligent equipment is a general term of wearable equipment (such as glasses, gloves, watches, clothing, etc.) developed by performing intelligent design on daily wear by adopting the wearable technology. The wearable intelligent equipment includes: wearable intelligent equipments (such as intelligent watches or intelligent glasses, etc) with complete functions, large sizes and capable of achieving all or a part of intelligent functions without relying on smartphones; and wearable intelligent equipments (such as all kinds of intelligent bracelets, intelligent jewelries and the like used for monitoring signs and symptoms) only focusing on a certain kind of intelligent application functions and needing to be cooperatively used with other equipment (such as smartphones). With the progress of technology and the change of user demands, the forms and application hotspots of the wearable intelligent equipment change continuously.

With the wearable intelligent device being paid more and more attention, the projecting wearable touch device also attracts a lot of attention. However, for the present projecting wearable touch device, since the touch surface is no longer the traditional touch screen, but may be a human palm or other human body region, in this case, accidentally touches may be performed onto the touch surface produced by projecting during human motion, and these touches are non-expected or ineffective touches, thus may cause inconvenience to users.

Therefore, how to ensure touch effectiveness becomes the technical problem to be solved urgently at present.

SUMMARY OF THE INVENTION

In view of the technical problem to be solved, an object of the present invention is to provide a wearable touch device and a wearable touch method for avoiding ineffective touch, the wearable touch device is small in volume and convenient to carry, and can ensure touch effectiveness.

The technical solution adopted to solve the technical problem in the present invention is a wearable touch device, comprising a carrier, a projecting unit, a monitoring unit and a processing unit, wherein the carrier is wearable; the projecting unit is used for projecting to a touch surface capable of being touched by a touch end; the monitoring unit is used for monitoring contact information between the touch end and the touch surface and sending the contact information to the processing unit; the processing unit is used for processing the contact information to judge whether the touch end effectively contacts the touch surface.

Preferably, the touch end is a human finger, and the touch surface capable of being touched by the touch end is any of other human body regions capable of being touched by the human finger. Judging whether the touch end effectively contacts the touch surface includes: judging whether there is a human body closing current formed between the touch end and the touch surface.

Preferably, the contact information includes resistance information, and the monitoring unit comprises a resistance information collecting unit for collecting present resistance information of the touch end and sending the present resistance information to the processing unit.

Preferably, the processing unit comprises a comparison module and a judging module, an initial resistance information is pre-stored in the processing unit, the comparison module is used for comparing the present resistance information with the initial resistance information and sending a comparison result to the judging module, the judging module judges whether there is the human body closing current formed between the touch end and the touch surface in accordance with the comparison result.

Preferably, the contact information includes contact strength information, the monitoring unit comprises a pressure monitoring unit or a vibration monitoring unit, the pressure monitoring unit or the vibration monitoring unit is used for monitoring the contact strength information produced between the touch end and the touch surface and sending the contact strength information to the processing unit, judging whether the touch end effectively contacts the touch surface further includes: judging whether the contact strength information is effective.

Preferably, the processing unit comprises a comparison module and a judging module, and a contact strength threshold information is pre-stored in the processing unit; the comparison module is used for comparing the contact strength information with the contact strength threshold information and sending a comparison result to the judging module, the judging module judges whether the contact strength information is effective in accordance with the comparison result.

Preferably, judging whether the touch end effectively contacts the touch surface includes: when it is judged that there is a human body closing current formed between the touch end and the touch surface and the contact strength information is effective, it is judged that the touch end effectively contacts the touch surface; when it is judged that there is a human body closing current formed between the touch end and the touch surface but the contact strength information is ineffective, or when it is judged that there is no human body closing current formed between the touch end and the touch surface, it is judged that the touch end does not effectively contact the touch surface.

Preferably, the resistance information collecting unit comprises a resistance sensor, both the resistance sensor and the processing unit are provided in the carrier, the carrier is capable of being worn on the human finger acting as the touch end, and the resistance sensor is provided on an inner surface of the carrier.

Preferably, the carrier is made of PVC material.

The technical solution adopted to solve the technical problem in the present invention is a wearable touch method, comprising steps of: projecting to a touch surface capable of being touched by a touch end; monitoring contact information between the touch end and the touch surface; processing the contact information to judge whether the touch end effectively contacts the touch surface.

Preferably, the touch end is a human finger, and the touch surface capable of being touched by the touch end is any of other human body regions capable of being touched by the human finger. Judging whether the touch end effectively contacts the touch surface includes: judging whether there is a human body closing current formed between the touch end and the touch surface.

Preferably, the contact information includes resistance information, and the step of monitoring the contact information between the touch end and the touch surface includes: collecting present resistance information of the touch end.

Preferably, the step of processing the contact information includes: comparing the present resistance information with pre-stored initial resistance information; and judging whether there is the human body closing current formed between the touch end and the touch surface in accordance with a comparison result.

Preferably, when the comparison result indicates that the present resistance information is reduced by more than 5% with respect to the initial resistance information, it is judged that there is a human body closing current formed between the touch end and the touch surface.

Preferably, the contact information includes contact strength information, wherein, the step of monitoring the contact information between the touch end and the touch surface includes: monitoring the contact strength information produced between the touch end and the touch surface, judging whether the touch end effectively contacts the touch surface further includes: judging whether the contact strength information is effective.

Preferably, the step of processing the contact information includes: comparing the contact strength information with pre-stored contact strength threshold information; judging whether the contact strength information is effective in accordance with a comparison result.

Preferably, judging whether the touch end effectively contacts the touch surface includes: when it is judged that there is a human body closing current formed between the touch end and the touch surface and the contact strength information is effective, it is judged that the touch end effectively contacts the touch surface; when it is judged that there is a human body closing current formed between the touch end and the touch surface but the contact strength information is ineffective, or when it is judged that there is no human body closing current formed between the touch end and the touch surface, it is judged that the touch end does not effectively contact the touch surface.

Preferably, when the comparison result indicates that the contact strength information exceeds the contact strength threshold information by 5%, it is judged that the contact strength information is effective.

The present invention has following advantages: with the wearable touch device of the present invention, when the touch end (e.g., the human finger) contacts the touch surface (e.g., any of other human body regions), since there is a human body closing current formed between the touch end and the touch surface, and the present resistance information of the touch end can be monitored by the resistance information collecting unit (e.g., a resistance sensor), therefore, the touch effectiveness may be judged based on the human body closing current/voltage; alternatively, the contact strength information between the touch end and the touch surface can be further monitored by using the pressure monitoring unit (e.g., a pressure sensor) or the vibration monitoring unit (e.g., a vibration sensor), to judge the touch effectiveness. The wearable touch device of the present invention is small in volume and convenient to carry, and can ensure touch effectiveness.

DETAILED DESCRIPTION OF THE EMBODIMENTS

To make those skilled in the art better understand the technical solutions of the present invention, the wearable touch device and the wearable touch method in the present invention will be further described below in detail in combination with the accompanying drawings and specific implementations.

There is provided a wearable touch device comprising a carrier, a projecting unit, a monitoring unit and a processing unit, wherein the carrier is wearable; the projecting unit is used for projecting to a touch surface capable of being touched by a touch end; the monitoring unit is used for monitoring contact information between the touch end and the touch surface and sending the contact information to the processing unit; the processing unit is used for processing the contact information to judge whether the touch end effectively contacts the touch surface.

There is provided a wearable touch method comprising steps of: projecting to a touch surface capable of being touched by a touch end; monitoring contact information between the touch end and the touch surface; processing the contact information to judge whether the touch end effectively contacts the touch surface.

The wearable touch device and the corresponding wearable touch method can ensure the touch effectiveness.

First Embodiment

This embodiment provides a wearable touch device and a corresponding wearable touch method.

Figure 1:
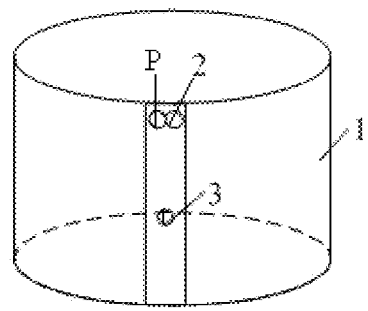
FIG. 1 is a schematic diagram of a structure of a wearable touch device in a first embodiment of the present invention.

As shown in FIG. 1, the wearable touch device in this embodiment comprises a carrier 1, a projecting unit P, a monitoring unit 2 and a processing unit 3.

The carrier 1 is wearable, for example, on a human finger, so that the wearable touch device containing the carrier 1 is worn on the human body (e.g., the human finger) by means of the carrier 1.

The projecting unit performs projecting to the touch surface 5 (referring to FIG. 2) capable of being touched by the touch end 4.

The monitoring unit 2 is used for monitoring the contact information between the touch end and the touch surface and sending the contact information to the processing unit 3.

The processing unit 3 is used for processing the contact information to judge whether the touch end effectively contacts the touch surface.

Figure 2:
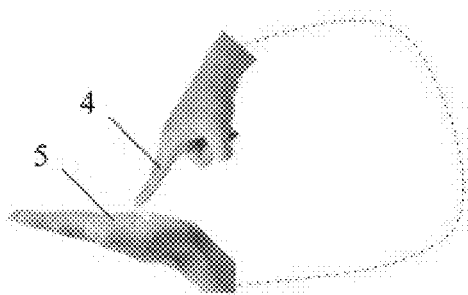
FIG. 2 is a schematic diagram of touching by the wearable touch device in FIG. 1.

As shown in FIG. 2, the touch end 4 may be a human finger, the touch surface capable of being touched by the touch end 4 may be any of other human body regions (e.g., palm) capable of being touched by the human finger. That is, the touch surface 5 may be formed, for example, on a palm. In this case, when the touch end 4 contacts the touch surface 5, a human body closing current (voltage) is formed, the resistance of the touch end is changed (for example, reduced). However, when any other object (non-conductive object, specifically, not a human body finger) contacts the touch surface, no human body closing current is formed. Therefore, whether there is a human body closing current formed between the touch end and the touch surface may be monitored (for example, whether the resistance of the touch end is reduced to some extent is monitored) to judge whether the touch end effectively contacts the touch surface, so that error touch due to ineffective contact can be avoided. In this embodiment, the touch surface may be formed on any curved or plane surface of other human body regions (except the human finger acting as the touch end) capable of being directly touched by the touch end.

For example, when the human finger acting as the touch end touches any other human body region acting as the touch surface, the equivalent resistance between the human finger and the other human body region is changed, so that a closing current is formed between the human finger and the other human body region. As shown in FIG. 2, for example, when a human finger of right hand acting as the touch end touches the palm of left hand acting as the touch surface, the equivalent resistance between the human finger of right hand and the palm of left hand is changed, so that a closing current is formed between the human finger of right hand and the palm of left hand. Therefore, whether there is a closing current formed between the human finger of right hand and the palm of left hand may be judged to identify whether the human finger of right hand effectively contacts the palm of left hand. If there is no closing current formed between the human finger of right hand and the palm of left hand, it indicates that the human finger of right hand does not effectively contact the palm of left hand, that is, there is no effective touch.

Considering the aspect of measurement, the change (i.e., reduction) in the human body resistance directly indicates that a closing current is formed. Therefore, in this embodiment, the contact information may include resistance information, the monitoring unit 2 may comprise a resistance information collecting unit, and the resistance information collecting unit may be a resistance sensor for collecting the present resistance information of the touch end 4 and sending the present resistance information to the processing unit 3. Of course, it should be understood that, the resistance information collecting unit may be any equipment capable of measuring the human body resistance. Usually, the human body resistance may be affected by the skin state, the contact area, the contact pressure and other various factors, and thus may be varied in a large range. In this embodiment, the original resistance of the human finger acting as the touch end is considered in a range from $1000\Omega$ to $2000\Omega$, for example, the original resistance of the human finger may be $2000\Omega$. When the human finger of right hand effectively contacts the palm of left hand acting as the touch surface, a non-zero closing current is formed between the human finger of right hand and the palm of left hand (that is, the present resistance of the human finger is reduced with respect to the original resistance, for example, is reduced by more than 5%), and when no closing current is formed (that is, the closing current is zero), the human finger does not effectively contact the human palm.

The processing unit 3 may comprise a comparison module and a judging module (not shown in FIG. 1), and initial resistance information is pre-stored in the processing unit 3, wherein, the comparison module is used for comparing the present resistance information with the initial resistance information and sending the comparison result to the judging module, the judging module is used for judging whether there is a human body closing current between the touch end and the touch surface in accordance with the comparison result. Preferably, the processing unit 3 may be implemented by a micro-processor (for example, single chip microcomputer).

In the present embodiment, the change of the resistance of the touch end (e.g., the human finger) is monitored to judge whether the touch end effectively contacts the touch surface. Usually, the larger the human body closing current formed between touch end and the touch surface, the more significant the change of the resistance of the touch end, thus the judgment of the touch effectiveness may be achieved by monitoring the change of the resistance of the touch end.

Preferably, the carrier 1 is made of PVC material. For example, the carrier 1 is formed as a ring, the material thereof is insulating, and the structure thereof is strong. Therefore, the structures and the positions of elements in the carrier 1 are stable, so that the effective operation of the wearable touch device containing the carrier 1 can be ensured, and the security of the human body wearing the wearable touch device can also be ensured. Further preferably, the carrier 1 is worn on the human finger acting as the touch end, both the monitoring unit 2 (for example, including a resistance sensor) and the processing unit 3 are provided in the carrier 1, the resistance sensor is provided on the inner surface of the carrier 1 so that the present resistance information of the touch end can be sensed better.

Of course, the wearable touch device of the present embodiment may further comprise an execution unit which can determine the specific touch position of the touch end on a virtual touch surface and acquire the touch command corresponding to the determined touch position after judging that the touch end effectively contacts the touch surface, so that a corresponding touch response is performed in accordance with the touch command. When it is judged that the touch end does not effectively contact the touch surface, a return command may be performed to continue to monitor the contact information between the touch end and the touch surface, which will not be described in detail here.

Correspondingly, the present embodiment provides a wearable touch method comprising the following steps S1 to S3.

S1, projecting to the touch surface capable of being touched by the touch end.

S2, monitoring the contact information between the touch end and the touch surface.

For example, the touch end is a human finger, and the touch surface capable of being touched by the touch end is any other human body region (e.g., palm) capable of being touched by the human finger. The contact information includes resistance information. The step of monitoring the contact information between the touch end and the touch surface may include: collecting the present resistance information of the touch end.

S3, processing the contact information to judge whether the touch end effectively contacts the touch surface.

For example, the step of processing the contact information includes: comparing the present resistance information with the pre-stored initial resistance information; and judging whether there is a human body closing current formed between the touch end and the touch surface in accordance with the comparison result. Preferably, when the comparison result indicates that the present resistance information is reduced by more than 5% with respect to the initial resistance information, it is judged that there is a human body closing current formed between the touch end and the touch surface.

Of course, when it is judged that the touch end effectively contacts the touch surface, the specific touch position of the touch end on the touch surface may be further determined, and a touch command corresponding to the determined touch position is acquired, so that a corresponding touch response is performed in accordance with the touch command. When it is judged that the touch end does not effectively contact the touch surface, a return command (for example, returning to step S2) may be performed to continue to monitor the contact information between the touch end and the touch surface, which will not be described in detail here.

Figure 3:
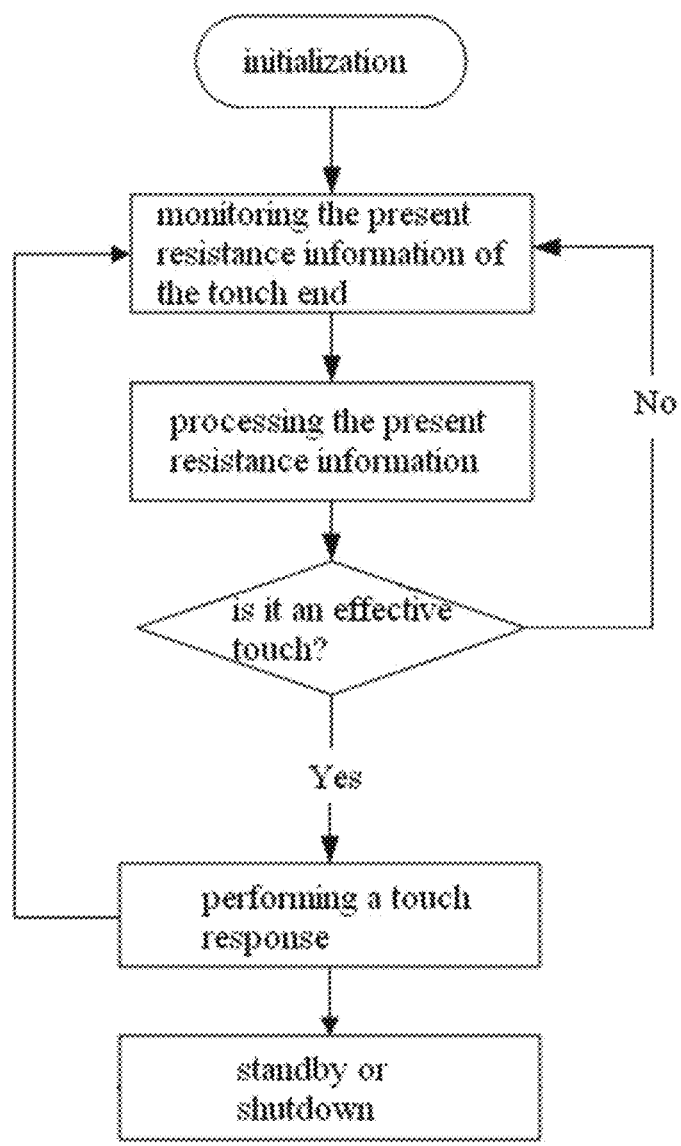
FIG. 3 is a touch flowchart of a wearable touch method in a first embodiment of the present invention.

FIG. 3 is a touch flowchart of the wearable touch method in the present embodiment.

In the wearable touch method, the touch end is a human finger, and the touch surface capable of being touched by the touch end is any other human body region (e.g., palm) capable of being touched by the human finger, that is, the touch surface is formed, for example, on the palm.

First, an initialization is performed, for example, the initial resistance information of the touch end is pre-stored.

Then, the present resistance information of the touch end is monitored and processed to judge whether there is a human body closing current formed between the touch end and the touch surface. Usually, the larger the human body closing current formed between the touch end and the touch surface, the larger the change (reduction) of the present resistance information of the touch end with respect to the initial resistance information. For example, when the present resistance information of the touch end is reduced by more than 5% with respect to the initial resistance information, it is judged that a human body closing current is formed between the touch end and the touch surface.

When it is judged that a human body closing current is formed between the touch end and the touch surface, it is judged that the touch end effectively contacts the touch surface.

Then, the specific touch position of the touch end on the touch surface is determined so as to determine a corresponding touch command and perform a corresponding touch response.

When it is judged that the touch end does not effectively contact the touch surface, a return command may be performed to continue to monitor the present resistance information of the touch end.

Of course, the wearable touch device may perform the above wearable touch method circularly, until the wearable touch device is standby or shutdown.

In the technical solutions of the present embodiments, whether the touch end effectively contacts the touch surface is judged by monitoring whether there is a human body closing current/voltage formed between the touch end and the touch surface, for example, by monitoring the change in the resistance of the touch end, so that touch effectiveness can be ensured.

Second Embodiment

The present embodiment provides a wearable touch device and a corresponding wearable touch method. Compared with the first embodiment, the monitoring unit 2 of the present embodiment further comprises a pressure monitoring unit (for example, a pressure sensor) beside the resistance information collecting unit of the first embodiment, that is, in the present embodiment, the contact information further includes contact strength information, and judging whether the touch end effectively contacts the touch surface further includes: judging whether the contact strength information is effective.

Specifically, the pressure monitoring unit is used for monitoring the contact strength information produced between the touch end and the touch surface and sending the contact strength information to the processing unit 3.

The pressure monitoring unit of the present embodiment may be a pressure sensor, for example, may be a resistance strain gauge pressure sensor, a semiconductor strain gauge pressure sensor, a piezoresistive pressure sensor or the like. It should be understood that, the pressure monitoring unit may be any equipment capable of directly or indirectly acquiring a pressure change, preferably is a resistance strain gauge pressure sensor, because the resistance strain gauge pressure sensor has a simple structure, high output precision, good linearity and stability, and low purchase price, and it is convenient to buy the resistance strain gauge pressure sensor.

The processing unit 3 comprises a comparison module and a judging module, and a contact strength threshold information is pre-stored in the processing unit 3, wherein, the comparison module is used for comparing the contact strength information with the contact strength threshold information and sending a comparison result to the judging module, the judging module judges whether the contact strength information is effective in accordance with the comparison result. Preferably, the processing unit 3 is implemented by a micro-processor (for example, a single chip microcomputer)

In this embodiment, judging whether the touch end effectively contacts the touch surface includes: when it is judged that there is a human body closing current formed between the touch end and the touch surface and the contact strength information is effective, it is judged that the touch end effectively contacts the touch surface; when it is judged that there is a human body closing current formed between the touch end and the touch surface but the contact strength information is ineffective, or when it is judged that there is no human body closing current formed between the touch end and the touch surface, it is judged that the touch end does not effectively contact the touch surface.

In this embodiment, whether the touch end effectively contacts the touch surface is judged by monitoring the resistance change of the touch end and the contact strength information between the touch end and the touch surface. Usually, the larger the contact strength between the touch end and the touch surface, the larger the resistance change (i.e., reduction) of the touch end. Therefore, the judgement of the touch effectiveness may be achieved by monitoring the resistance information of the touch end and the contact strength information between the touch end and the touch surface.

In this embodiment, the carrier 1 still may be made of PVC material. Preferably, the carrier 1 is capable of being worn on a human finger, for example, the carrier 1 is formed as a ring, the monitoring unit 2 (for example, including a resistance sensor and a pressure sensor) and the processing unit 3 may be both provided in the carrier 1, for example, the resistance sensor is provided on the inner surface of the carrier 1 so that the resistance information of the human finger acting as the touch end can be sensed better, and the pressure sensor may be provided at any appropriate position, as long as it can monitor the contact strength information between the touch end and the virtual touch surface.

Correspondingly, the present embodiment provides a wearable touch method. Compared with the first embodiment, in this wearable touch method, the contact information includes contact strength information, wherein the step of monitoring the contact information between the touch end and the touch surface includes: monitoring the contact strength information produced between the touch end and the touch surface; judging whether the touch end effectively contacts the touch surface further includes: judging whether the contact strength information is effective.

Correspondingly, the step of processing the contact information includes: comparing the contact strength information with the pre-stored contact strength threshold information; judging whether the contact strength information is effective in accordance with the comparison result.

Further preferably, judging whether the touch end effectively contacts the touch surface includes: when it is judged that there is a human body closing current formed between the touch end and the touch surface and the contact strength information is effective (for example, when the present resistance information of the human finger acting as the touch end is reduced by more than 5% with respect to the initial resistance information thereof, and the contact strength information exceeds the contact strength threshold information by 5%), it is judged that the touch end effectively contacts the touch surface; when it is judged that there is a human body closing current formed between the touch end and the touch surface but the contact strength information is ineffective, or when it is judged that no human body closing current is formed between the touch end and the touch surface, it is judged that the touch end does not effectively contact the touch surface.

Here, it should be understood that, if a human body closing current is formed between the touch end and the touch surface but the contact strength information is ineffective, it indicates that the touch end (e.g., the human finger) only lightly brushes the touch surface (e.g., the human palm), or the touch end only accidentally other than intentionally touch the touch surface. Thus, in this case, it is judged that the touch end does not effectively contact the touch surface, and no touch response is performed.

Figure 4:
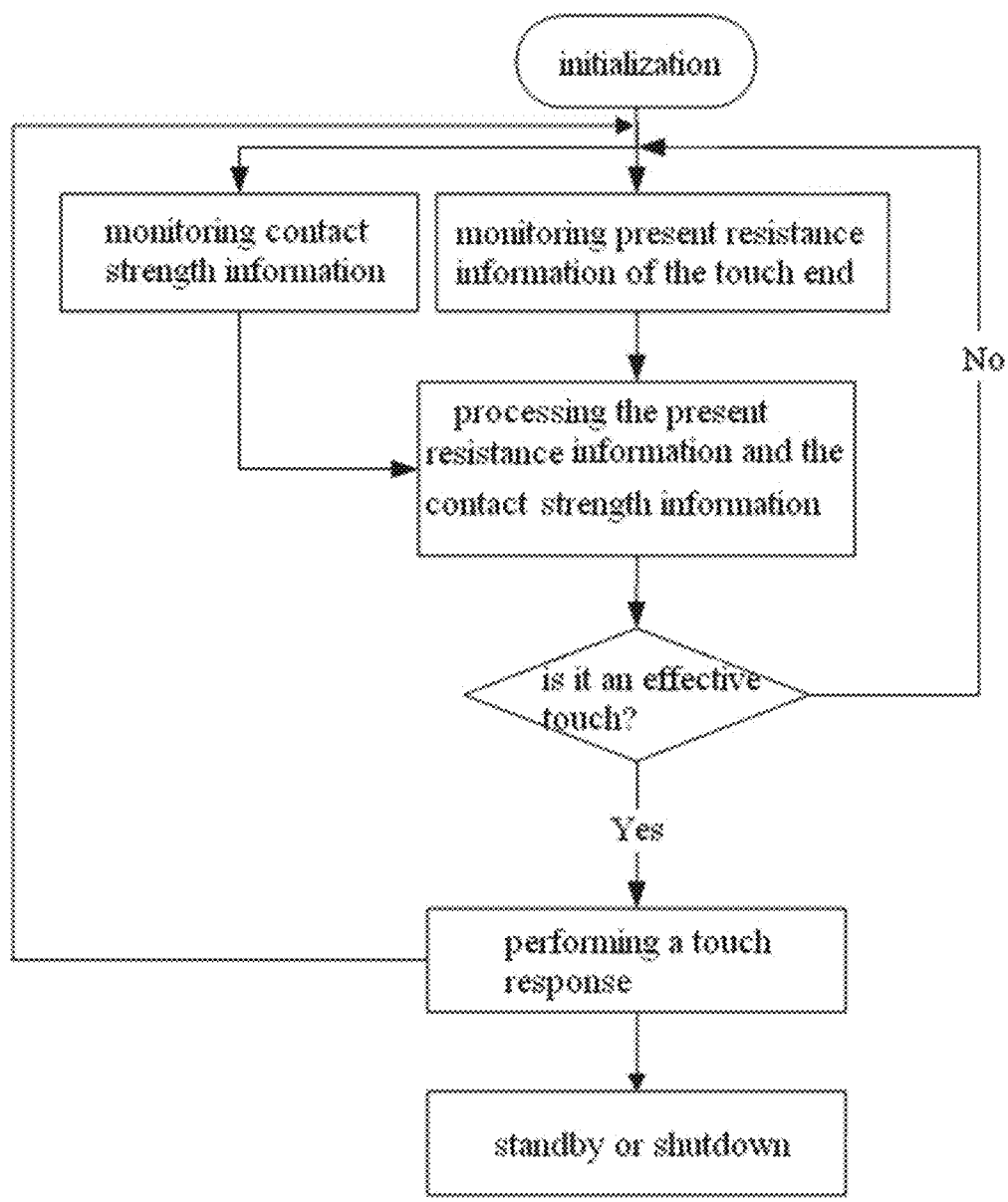
FIG. 4 is a touch flowchart of a wearable touch method in a second embodiment of the present invention.

FIG. 4 is a touch flowchart of the wearable touch method in the present embodiment.

In this wearable touch method, first, an initialization is performed, for example, the initial resistance information of the touch end (for example, the human finger) and the contact strength threshold information are pre-stored.

Then, the present resistance information of the touch end and the contact strength information between the touch end and the touch surface (for example, the human palm) are monitored and processed to judge whether the touch end effectively contacts the touch surface.

For example, when the human finger acting as the touch end intentionally touches the human palm acting the touch surface but does not truly touch the human palm, that is, the pressure sensor may sense a certain contact strength but the resistance change monitored by the resistance sensor is zero, in this case, it is judged that the human finger does not effectively contact the human palm. Alternatively, when the contact strength monitored by the pressure sensor is zero but a certain resistance change (may be more than 5%) is monitored by the resistance sensor, it should be understood that the human finger may only lightly brush the human palm, that is, the human finger only accidentally touches other than intentionally touches the human palm, at this time, it is judged that the human finger does not effectively contact the human palm. Only when the contact strength monitored by the pressure sensor is not zero (for example, is larger than the contact strength threshold by about 5%) and a certain resistance change (for example, may be more than 5%) is monitored by the resistance sensor, it is judged that the human finger acting as the touch end effectively contacts the human palm acting as the touch surface, thus a corresponding touch response is performed.

When it is judged that the touch end does not effectively contact the touch surface, a return command may be performed to continue to monitor the present resistance information of the touch end and the contact strength information between the touch end and the touch surface.

Of course, the wearable touch device may perform the above wearable touch method circularly, until the wearable touch device is standby or shutdown.

Other parts of the wearable touch device and the corresponding wearable touch method of the present embodiment are the same as those in the first embodiment, which will not be described repeatedly here.

In the present embodiment, besides whether there is a human body closing current/voltage formed between the touch end and the touch surface is monitored, the contact strength information between the touch end and the touch surface is also monitored so as to judge the touch effectiveness, the touch effectiveness can be further ensured.

Third Embodiment

The present embodiment provides a wearable touch device and a corresponding wearable touch method. Compared with the second embodiment, the monitoring unit 2 of the present embodiment comprises a vibration monitoring unit instead of the pressure monitoring unit, for example, the vibration monitoring unit may be a vibration sensor, that is, the contact strength information (i.e., vibration information) produced between the touch end and the touch surface is monitored by the vibration sensor and is sent to the processing unit 3, so as to judge the touch effectiveness.

Specifically, in the present embodiment, when the touch end (e.g., the human finger) knocks on the touch surface (e.g., the human palm), while monitoring the present resistance information of the touch end by the resistance sensor, the contact strength information produced between the touch end and the touch surface when the touch end knocks on the touch surface is also monitored by the vibration sensor, then the present resistance information and the contact strength information are processed in the processing unit, so as to judge whether the touch end effectively contacts the touch surface.

More specifically, when the human finger acting as the touch end makes a knock action or moves up and down but does not truly touch the human palm, that is, a certain vibration is monitored by the vibration sensor but the resistance change monitored by the resistance sensor is zero, in this case, it is judged that the human finger does not effectively contact the human palm. Alternatively, when no vibration is monitored by the vibration sensor but a certain resistance change (may be more than 5%) is monitored by the resistance sensor, it should be understood that the human finger only lightly brushes the human palm, that is, the human finger only accidentally other than intentionally touches the human palm, at this time, it is also judged that the human finger does not effectively contact the human palm. Only when the vibration monitored by the vibration sensor is not zero (for example, is larger than a vibration threshold by about 5%) and a certain resistance change (for example, may be more than 5%) is monitored by the resistance sensor, it is judged that the human finger acting as the touch end effectively contacts the human palm on which a virtual touch surface is formed, thus a corresponding touch response is performed.

Other parts of the wearable touch device of the present embodiment are the same as those in the second embodiment, which will not be described repeatedly here.

The corresponding wearable touch method of the present embodiment is similar to that in the second embodiment, which will not be described repeatedly here.

In the present embodiment, besides whether there is a human body closing current/voltage formed between the touch end and the touch surface is judged by monitoring the resistance information of the touch end through the resistance sensor, the contact strength information between the touch end and the touch surface is also monitored by the vibration sensor so as to verify the touch effectiveness, the touch effectiveness can be further improved.

It should be understood that, the monitoring unit 2 may comprise any other equipment capable of monitoring the human body closing current/voltage, quantitatively measuring the resistance, or monitoring the contact strength, but it is not limited to the resistance sensor, the pressure sensor or the vibration sensor shown in the first through third embodiments, and may be set and configured flexibly and correspondingly in specific application examples for different objects for wearing or touching, which will not be described one by one.

In the wearable touch device and the corresponding wearable touch method of the present invention, when the touch end is a human body part (for example, the human finger) and the touch surface is any other human body region (other than the human body part, for example, the human palm), the touch effectiveness between the touch end and the touch surface may be judged by monitoring whether there is a human body closing current/voltage formed between the touch end and the touch surface (for example, by monitoring the resistance change of the touch end) through the monitoring unit (for example, the resistance sensor); alternatively, the contact strength information between the touch end and the touch surface is further monitored, for example, by the pressure sensor or the vibration sensor, to further judge whether the touch end effectively contacts the touch surface, the touch effectiveness is further ensured. The wearable touch device has a small volume, is convenient to be carried, and can effectively ensure the touch effectiveness.

It can be understood that, the foregoing implementations are merely exemplary implementations used for illustrating the principle of the present invention, rather than limiting the present invention. Those of ordinary skill in the art may make various variations and improvements without departing from the spirit and essence of the present invention, and these variations and improvements should be encompassed in the protection scope of the present invention.

The invention claimed is:

1. A wearable touch device, comprising:
   a carrier that is wearable;
   a projector for projecting to a touch surface capable of being touched by a touch end;
   a sensor for monitoring contact information between the touch end and the touch surface and sending the contact information to a processing unit; and
   the processing unit for processing the contact information to judge whether the touch end effectively contacts the touch surface; wherein
   the touch end is a human finger, and the touch surface capable of being touched by the touch end is any other human body region capable of being touched by the human finger, and
   judging whether the touch end effectively contacts the touch surface includes: judging whether there is a human body closing current formed between the touch end and the touch surface;
   wherein the contact information includes contact strength information, the sensor comprises a pressure sensor or a vibration sensor, the pressure sensor or the vibration sensor is configured for monitoring the contact strength information produced between the touch end and the touch surface and sending the contact strength information to the processing unit, and
   judging whether the touch end effectively contacts the touch surface further includes:
   not only judging whether there is a human body closing current formed between the touch end and the touch surface, but also judging whether the contact strength information is effective, and wherein
   when it is judged that the human body closing current is formed between the touch end and the touch surface and the contact strength information is effective, it is judged that the touch end effectively contacts the touch surface; and
   when it is judged that the human body closing current is formed between the touch end and the touch surface but the contact strength information is ineffective, or when it is judged that there is no human body closing current formed between the touch end and the touch surface, it is judged that the touch end does not effectively contact the touch surface.

2. The wearable touch device of claim 1, wherein the contact information includes resistance information, and the sensor comprises a resistance information collecting unit for collecting present resistance information of the touch end and sending the present resistance information to the processing unit.

3. The wearable touch device of claim 2, wherein the processing unit comprises a comparison module and a judging module, an initial resistance information is pre-stored in the processing unit,
   the comparison module is used for comparing the present resistance information with the initial resistance information and sending a comparison result to the judging module, the judging module judges whether there is the human body closing current formed between the touch end and the touch surface in accordance with the comparison result.

4. The wearable touch device of claim 1, wherein the processing unit comprises a comparison module and a judging module, and a contact strength threshold information is pre-stored in the processing unit;
   the comparison module is used for comparing the contact strength information with the contact strength threshold information and sending a comparison result to the judging module, the judging module judges whether the contact strength information is effective in accordance with the comparison result.

5. The wearable touch device of claim 2, wherein the resistance information collecting unit comprises a resistance sensor, both the resistance sensor and the processing unit are provided in the carrier, the carrier is capable of being worn on the human finger acting as the touch end, and the resistance sensor is provided on an inner surface of the carrier.

6. The wearable touch device of claim 1, wherein the carrier is made of PVC material.

7. A wearable touch method, comprising steps of:
projecting to a touch surface capable of being touched by a touch end;
monitoring contact information between the touch end and the touch surface; and
processing the contact information to judge whether the touch end effectively contacts the touch surface; wherein
the touch end is a human finger, and the touch surface capable of being touched by the touch end is any of other human body regions capable of being touched by the human finger, and judging whether the touch end effectively contacts the touch surface includes: judging whether there is a human body closing current formed between the touch end and the touch surface;
the contact information includes the contact strength information, and wherein
the step of monitoring the contact information between the touch end and the touch surface includes: monitoring the contact strength information produced between the touch end and the touch surface, and
judging whether the touch end effectively contacts the touch surface further includes:
not only judging whether there is a human body closing current formed between the touch end and the touch surface, but also judging whether the contact strength information is effective, wherein
when it is judged that the human body closing current is formed between the touch end and the touch surface and the contact strength information is effective, it is judged that the touch end effectively contacts the touch surface; and
when it is judged that the human body closing current is formed between the touch end and the touch surface but the contact strength information is ineffective, or when it is judged that there is no human body closing current formed between the touch end and the touch surface, it is judged that the touch end does not effectively contact the touch surface.

8. The wearable touch method of claim 7, wherein the contact information includes resistance information, and
the step of monitoring the contact information between the touch end and the touch surface includes: collecting present resistance information of the touch end.

9. The wearable touch method of claim 8, wherein the step of processing the contact information includes:
comparing the present resistance information with pre-stored initial resistance information; and
judging whether there is the human body closing current formed between the touch end and the touch surface in accordance with a comparison result.

10. The wearable touch method of claim 9, wherein when the comparison result indicates that the present resistance information is reduced by more than 5% with respect to the initial resistance information, it is judged that there is a human body closing current formed between the touch end and the touch surface.

11. The wearable touch method of claim 7, wherein the step of processing the contact information includes:
comparing the contact strength information with pre-stored contact strength threshold information; and
judging whether the contact strength information is effective in accordance with a comparison result.

12. The wearable touch method of claim 11, wherein when the comparison result indicates that the contact strength information exceeds the contact strength threshold information by 5%, it is judged that the contact strength information is effective.

\* \* \* \* \*